(12) United States Patent  
Hui et al.

(10) Patent No.: US 8,815,727 B2
(45) Date of Patent: Aug. 26, 2014

(54) INTEGRATED CIRCUIT WITH METAL AND SEMI-CONDUCTING GATE

(71) Applicants: Advanced Micro Devices, Inc., Sunnyvale, CA (US); Spansion LLC, Sunnyvale, CA (US)

(72) Inventors: Angela T. Hui, Fremont, CA (US); Mark S. Chang, Los Altos, CA (US); Kuo-Tung Chang, Saratoga, CA (US); Scott A. Bell, San Jose, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/644,387

(22) Filed: Oct. 4, 2012

(65) Prior Publication Data
US 2013/0130487 A1   May 23, 2013

Related U.S. Application Data

(62) Division of application No. 11/611,856, filed on Dec. 16, 2006, now Pat. No. 8,283,718.

(51) Int. Cl.
*H01L 21/3205* (2006.01)
*H01L 21/4763* (2006.01)

(52) U.S. Cl.
USPC ............ 438/591; 438/586; 438/595; 438/585

(58) Field of Classification Search
USPC ..................... 438/591, 585, 586, 596, 589
See application file for complete search history.

(56) References Cited

U.S. PATENT DOCUMENTS

| 6,608,356 B1 * | 8/2003 | Kohyama et al. ............. 257/412 |
| 2007/0177440 A1 * | 8/2007 | Swift et al. ................... 365/200 |

* cited by examiner

*Primary Examiner* — Chuong A. Luu
(74) *Attorney, Agent, or Firm* — Farjami & Farjami LLP

(57) ABSTRACT

A method for forming an integrated circuit system is provided including forming a semi-conducting layer over a substrate, forming a spacer stack having a gap filler adjacent to the semi-conducting layer and a inter-layer dielectric over the gap filler, forming a transition layer having a recess over the semi-conducting layer and adjacent to the spacer stack, and forming a metal layer in the recess.

20 Claims, 5 Drawing Sheets

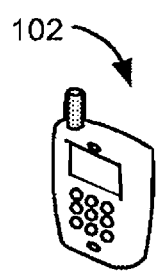
FIG. 1A
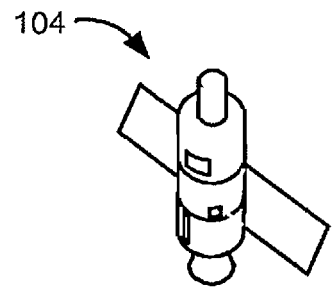
FIG. 1B
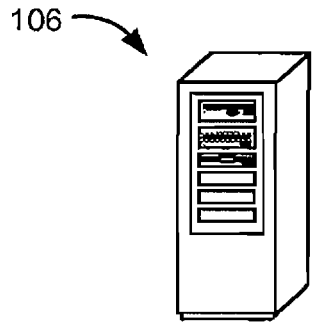
FIG. 1C
FIG. 2

INTEGRATED CIRCUIT WITH METAL AND SEMI-CONDUCTING GATE

This is a divisional of application Ser. No. 11/611,856 filed Dec. 16, 2006 now U.S. Pat. No. 8,283,718.

TECHNICAL FIELD

The present invention relates generally to integrated circuit systems and more particularly to integrated circuit systems having a memory system.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. One cornerstone for electronics to continue proliferation into everyday life is the non-volatile storage of information such as cellular phone numbers, digital pictures, or music files. Numerous technologies have been developed to meet these requirements.

There are many types of non-volatile data storage, such as Hard Disk Drives, magneto-optical drives, compact disk (CD), digital versatile disk (DVD), and magnetic tape. However, semiconductor based memory technologies have advantages of very small size, mechanical robustness, and low power. These advantages have created the impetus for various types of non-volatile memories, such as electrically erasable programmable read only memory (EEPROM) and electrically programmable read only memory (EPROM). EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become popular because it combines the advantages of the high density and low cost of EPROM with the electrical erasability of EEPROM. Flash memory can be rewritten and can hold its contents without power. Contemporary Flash memories are designed in a floating gate or a charge trapping architecture. Each architecture has its advantages and disadvantages.

The floating gate architecture offers implementation simplicity. This architecture embeds a gate structure, called a floating gate, inside a conventional metal oxide semiconductor (MOS) transistor gate stack. Electrons can be injected and stored in the floating gate as well as erased using an electrical field or ultraviolet light. The stored information may be interpreted as a value "0" or "1" from the threshold voltage value depending upon charge stored in the floating gate. As the demand for Flash memories increases, the Flash memories must scale with new semiconductor processes. However, new semiconductor process causes a reduction of key feature sizes in Flash memories of the floating gate architecture, which results in undesired increase in programming time, and decrease in data retention.

The charge trapping architecture offers improved scalability to new semiconductor processes compared to the floating gate architecture. One implementation of the charge trapping architecture is a silicon-oxide-nitride-oxide semiconductor (SONOS) where the charge is trapped in the nitride layer. The oxide-nitride-oxide structure has evolved to an oxide-silicon rich nitride-oxide (ORO) for charge trapping structure. Leakage and charge-trapping efficiency are two major parameters considered in device performance evaluation. Charge-trapping efficiency determines if the memory devices can keep enough charges in the storage nodes after program/erase operation and is reflected in retention characteristics. It is especially critical when the leakage behavior of storage devices is inevitable.

Programming speed and erasing speed are very important performance parameters for memory devices. The program speed and erase speed are directly related to the markets that the memory device is capable of serving. The markets are always demanding increases in memory density and performance. However, as physical dimensions decrease so that higher capacity memories can be manufactured, fundamental physical constraints cause the resistance of polysilicon layers to increase. The increase in the resistance of the polysilicon structures such as word lines in memories directly reduce the programming and erase speed of memories.

Thus, a need still remains for an integrated circuit system providing low cost manufacturing, improved yields, improved programming performance, and improved data density of memory in a system. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including forming a semi-conducting layer over a substrate, forming a spacer stack having a gap filler adjacent to the semi-conducting layer and a inter-layer dielectric over the gap filler, forming a transition layer having a recess over the semi-conducting layer and adjacent to the spacer stack, and forming a metal layer in the recess.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIGS. 1A, 1B, and 1C are schematic views of examples of electronics systems in which various aspects of the present invention may be implemented;

FIG. 2 is a plan view of an integrated circuit system in an embodiment of the present invention;

BEST MODE FOR CARRYING OUT THE INVENTION

Figure 3:
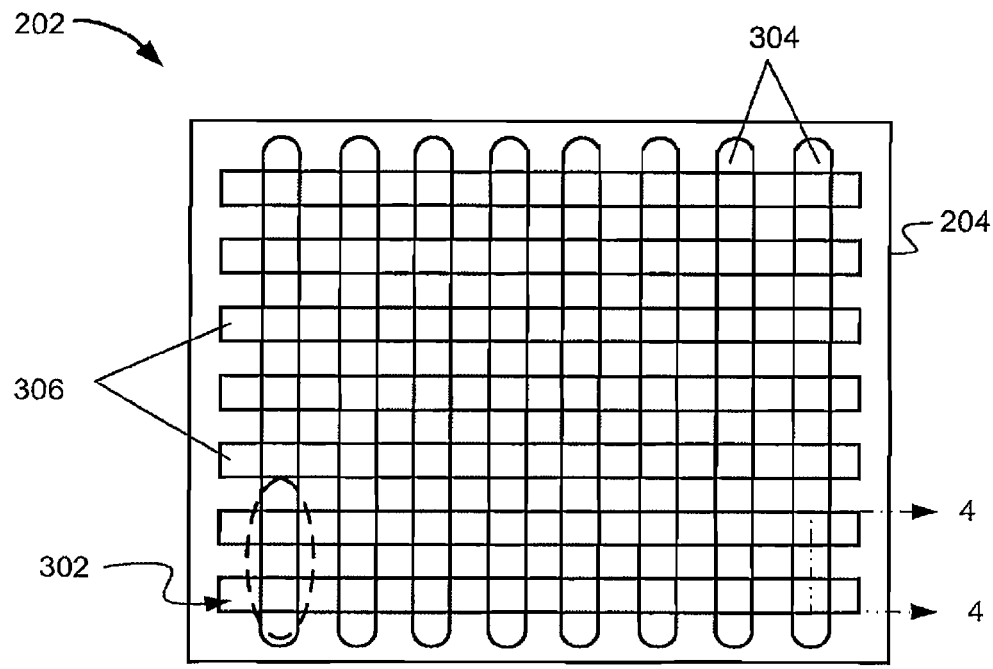
FIG. 3 is a more detailed plan view of a portion of the memory systems of FIG. 2.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIGS. 1A, 1B, and 1C, therein are shown schematic views of examples of electronics systems in which various aspects of the present invention may be implemented. A smart phone 102, a satellite 104, and a compute system 106 are examples of the electronic systems using the present invention. The electronic systems may be any system that performs any function for the creation, transportation, storage, and consumption of information. For example, the smart phone 102 may create information by transmitting voice to the satellite 104. The satellite 104 is used to transport the information to the compute system 106. The compute system 106 may be used to store the information. The smart phone 102 may also consume information sent from the satellite 104.

The electronic systems, such as the smart phone 102, the satellite 104, and the compute system 106, include a one or more subsystem, such as a printed circuit board having the present invention or an electronic assembly having the present invention. The electronic system may also include a subsystem, such as an adapter card.

Referring now to FIG. 2, therein is shown a plan view of an integrated circuit system 200 in an embodiment of the present invention. The plan view depicts memory systems 202 in a semiconductor substrate 204, wherein the semiconductor substrate 204 has one or more high-density core regions and one or more low-density peripheral portions are formed.

High-density core regions typically include one or more of the memory systems 202. Low-density peripheral portions typically include input/output (I/O) circuitry and programming circuitry for individually and selectively addressing a location in each of the memory systems 202.

The programming circuitry is represented in part by and includes one or more x-decoders 206 and y-decoders 208, cooperating with I/O circuitry 210 for connecting the source, gate, and drain of selected addressed memory cells to predetermined voltages or impedances to effect designated operations on the memory cell, e.g. programming, reading, and erasing, and deriving necessary voltages to effect such operations. For illustrative purposes, the integrated circuit system 200 is shown as a memory device, although it is understood that the integrated circuit system 200 may other semiconductor devices having other functional blocks, such as a digital logic block, a processor, or other types of memories.

Referring now to FIG. 3, therein is shown a more detailed plan view of a portion of the memory systems 202 of FIG. 2. The memory systems 202 have M×N arrays of a memory cell system 302. The semiconductor substrate 204 has a plurality of bit lines 304 extending in parallel with a plurality of word lines 306 extending in parallel and at right angles to the plurality of the bit lines 304. The word lines 306 and the bit lines 304 have contacts and interconnections (not shown) to the programming circuitry discussed in FIG. 2.

Figure 4:
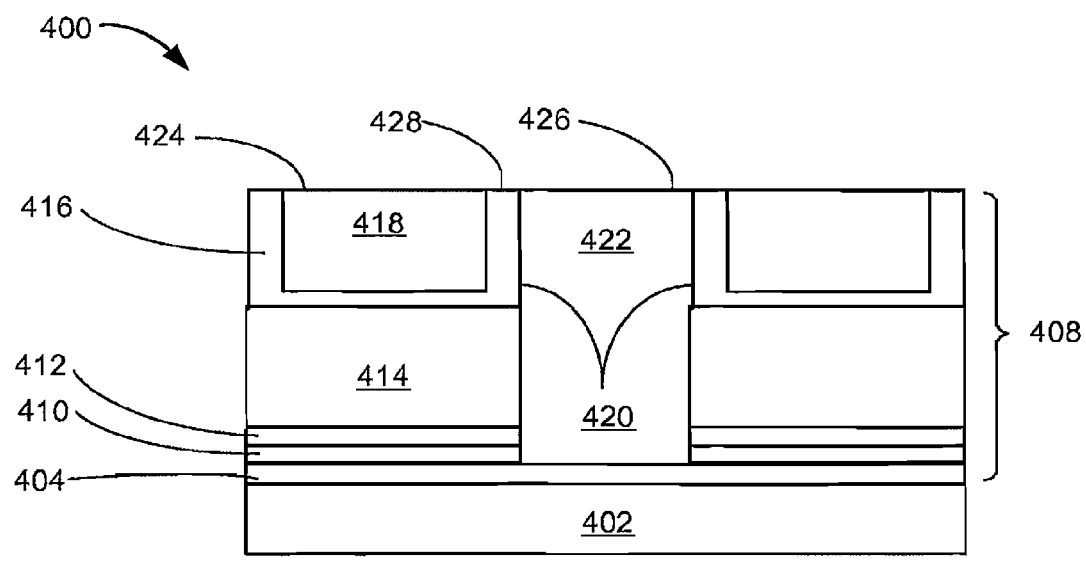
FIG. 4 is a cross-sectional view of a memory system along a line segment 4-4 of FIG. 3 in an embodiment of the present invention.

Referring now to FIG. 4, therein is a cross-sectional view of a memory system 400 along a line segment 4-4 of FIG. 3 in an embodiment of the present invention. The memory system 400 may represent the memory systems 202 of FIG. 2. The memory system 400 has a substrate 402, such as a semiconductor substrate. A first insulator layer 404, such as a bottom tunneling layer, is over the substrate 402. For example, the first insulator layer 404 may be formed to a thickness range about 50 to 100 angstroms.

A gate stack 408, such as a word line stack, may include a charge trap layer 410, such as a silicon rich nitride layer, over the first insulator layer 404. For example, the charge trap layer 410 may be formed to a thickness range about 50 to 200 angstroms. The gate stack 408 may also include a second insulator layer 412, such as a top blocking layer oxide layer, over the charge trap layer 410 and below a semi-conducting layer 414, such as a polysilicon layer. For example, the second insulator layer 412 may be formed to a thickness range about 50 to 100 angstroms. The gate stack 408 may further include a transition layer 416, such as a tungsten nitride (WN) transition layer, over the semi-conducting layer 414 and below a metal layer 418, such as a tungsten metal gate. For example, the transition layer 416 may be formed to a number of thickness values, such as 50 angstroms.

For illustrative purposes, the charge trap layer 410 is shown as a single layer, although it is understood that the charge trap layer 410 may have multiple layers, such as a nitride layer over a silicon rich nitride layer. Also for illustrative purposes, the charge trap layer 410 is shown as a single uniform layer, although it is understood that the charge trap layer 410 may include one or more layer having a concentration gradient, such as different gradient concentrations of silicon.

A gap filler 420, such as a nitride gap filler, is between adjacent instances of the gate stack 408. An inter-layer dielectric 422, such as an oxide layer, is over the gap filler 420 and between the adjacent instances of the gate stack 408. A first top surface 424 of the metal layer 418, a second top surface 426 of the inter-layer dielectric 422, and a third top surface 428 of the transition layer 416 are co-planar. The height of the metal layer 418 may vary for adjusting the resistance of the word lines 306 of FIG. 3 and the performance of the memory systems 202 of FIG. 2.

Figure 5:
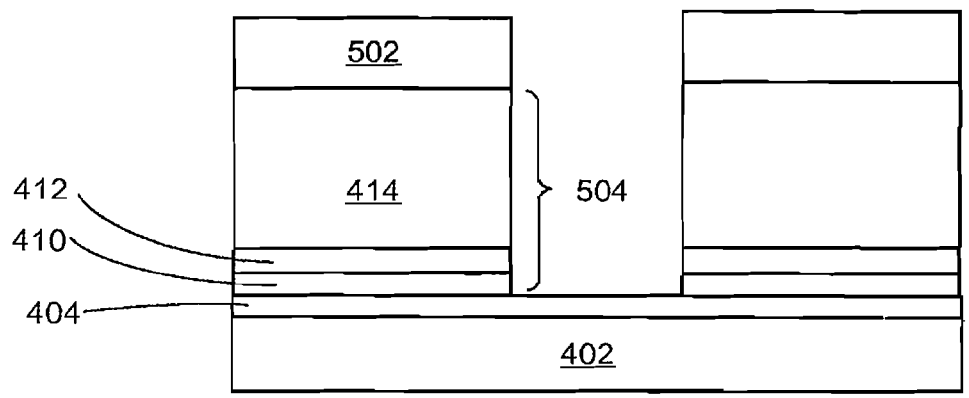
FIG. 5 is a cross-sectional view of the memory system of FIG. 4 in a mask phase.

Referring now to FIG. 5, therein is shown is a cross-sectional view of the memory system 400 of FIG. 4 in a mask phase. A portion of the gate stack 408 of FIG. 4 is formed over the substrate 402 and the first insulator layer 404. A mask layer 502, such as a hard mask comprised of nitride, is formed above the semi-conducting layer 414. The mask layer 502 may be applied over the substrate 402 by a number of different processes, such as spin coating. The mask layer 502 may be patterned by a number of different processes, such as a lithographic process.

For example, the lithographic process may form patterns of the mask layer 502 over the substrate 402 with exposure to a light source (not shown), such as an ultraviolet light source emitting a predetermined wavelength. The light exposure may harden portions of the mask layer 502. The portions of the mask layer 502 not exposed to the light may be removed forming the pattern of the mask layer 502.

The mask layer 502 provides a pattern over the charge trap layer 410, the second insulator layer 412, and the semi-conducting layer 414. Portions of the charge trap layer 410, the second insulator layer 412, and the semi-conducting layer 414 under the mask layer 502 are protected from additional processing, such as etching, to form an intermediate stack 504 of the gate stack 408. The intermediate stack 504 includes the charge trap layer 410, the second insulator layer 412, and the semi-conducting layer 414.

Figure 6:
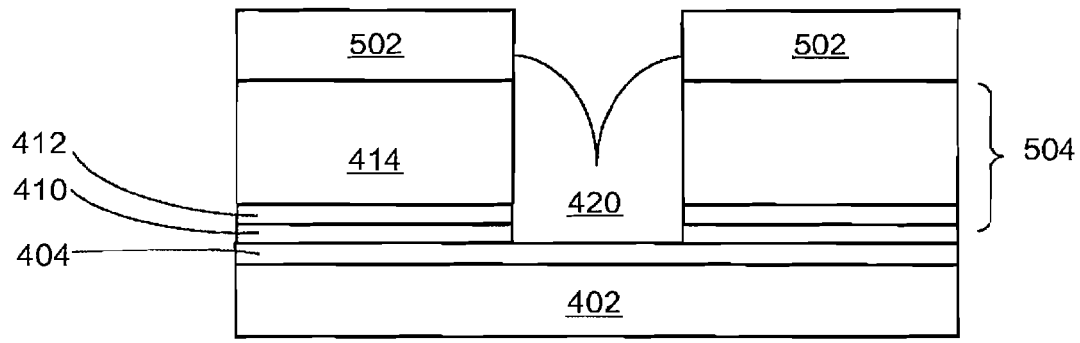
FIG. 6 is the structure of FIG. 5 in a spacer phase.

Referring now to FIG. 6, therein is shown is the structure of FIG. 5 in a spacer phase. The gap filler 420 is formed between the adjacent instances of the intermediate stack 504 and over the substrate 402. The gap filler 420 also covers a portion of the sides of the mask layer 502. The gap filler 420 may be formed by a number of different processes, such as chemical vapor deposition (CVD).

The gap filler 420 may serve as a protective barrier from contamination to the first insulator layer 404, the charge trap layer 410, the second insulator layer 412, and the semi-conducting layer 414. The contamination may be caused by subsequent processing steps, such as thermal annealing, during the formation of the transition layer 416 of FIG. 4 and the metal layer 418 of FIG. 4. The gap filler 420 also protects the intermediate stack 504 from adverse oxidation formation. These contaminations may cause degradation of the integrated circuit system 200 of FIG. 2.

Figure 7:
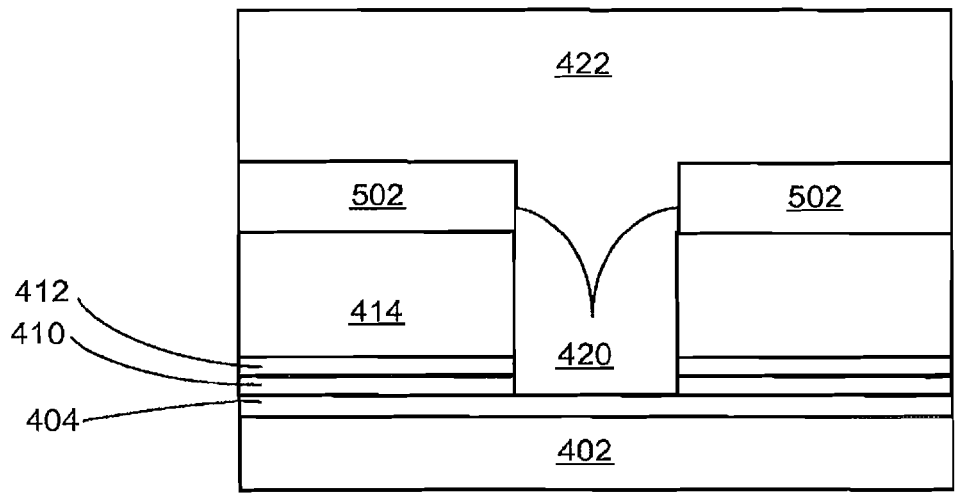
FIG. 7 is the structure of FIG. 6 in a dielectric phase.

Referring now to FIG. 7, therein is shown is the structure of FIG. 6 in a dielectric phase. A coating of the inter-layer dielectric 422 is over the substrate 402, the first insulator layer 404, the charge trap layer 410, the second insulator layer 412, the semi-conducting layer 414, and the mask layer 502. The inter-layer dielectric 422 may be formed by a number of different processes, such as a chemical vapor deposition (CVD) process, an atmospheric pressure chemical vapor deposition (APCVD) process, or a high density plasma (HDP) process. The inter-layer dielectric 422 may be comprised of a number of different materials, such as boron and phosphorus tetraethylorthosilane (BPTEOS), an oxide, or a p-type doped oxide.

Figure 8:
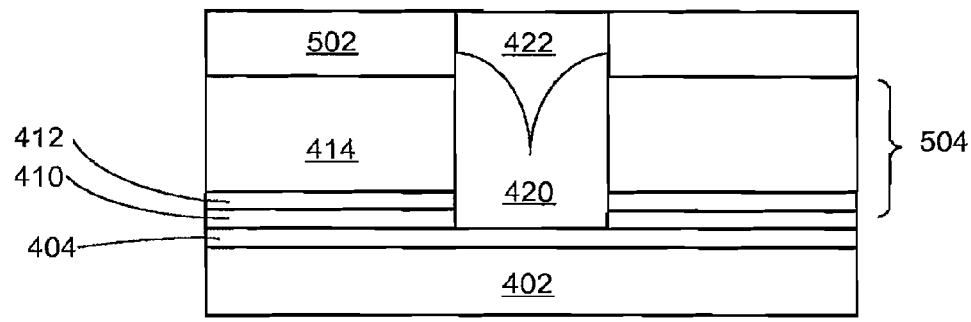
FIG. 8 is the structure of FIG. 7 in a planarization phase.

Referring now to FIG. 8, therein is shown is the structure of FIG. 7 in a planarization phase. The planarization process may be performed by a number of different processes, such as a chemical mechanical planarization (CMP) process. The planarization process forms the inter-layer dielectric 422 to be co-planar with the mask layer 502. The process of forming the inter-layer dielectric 422 of FIG. 7 may not be well controlled in the vertical direction. The surface contour of the coating of the inter-layer dielectric 422 may create difficulties for forming subsequent layers (not shown) with predetermined tolerances for achieving predetermined reliability and predetermined yield. The planarization phase smoothes the surface contour of the inter-layer dielectric 422 of FIG. 7 to predetermined limits.

The inter-layer dielectric 422 is over the gap filler 420 and between adjacent instances of the intermediate stack 504 having the charge trap layer 410, the second insulator layer 412, and the semi-conducting layer 414. The intermediate stack 504 is over the first insulator layer 404 and the substrate 402.

Figure 9:
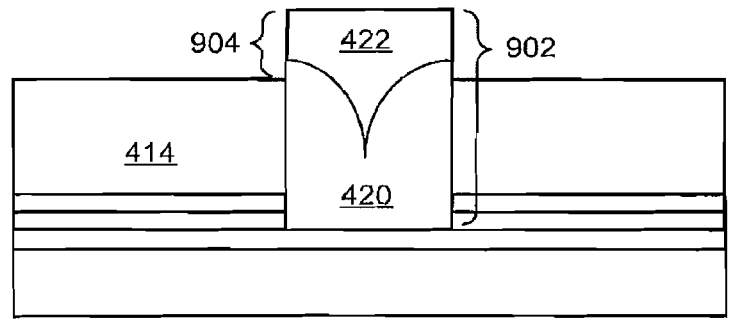
FIG. 9 is the structure of FIG. 8 in an etch phase.

Referring now to FIG. 9, therein is shown is the structure of FIG. 8 in an etch phase. The structure of FIG. 8 undergoes an etch process, such as a plasma etch, removing the mask layer 502 of FIG. 8 and having selectivity to stop at the semi-conducting layer 414 comprised of polysilicon. The etching process does not degrade the semi-conducting layer 414, the inter-layer dielectric 422, or the gap filler 420. The inter-layer dielectric 422 protects the gap filler 420 from the etching process forming a spacer stack 902, having the gap filler 420 and the inter-layer dielectric 422. An extension 904 of the spacer stack 902 represents the portion of the spacer stack 902 that is above the plane of the semi-conducting layer 414.

Figure 10:
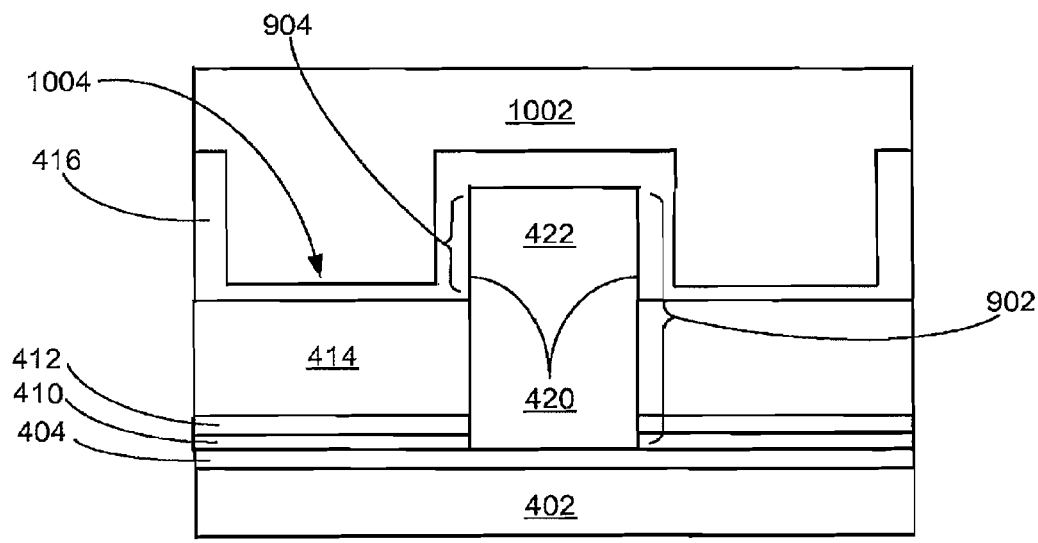
FIG. 10 is the structure of FIG. 9 in a metallization phase.

Referring now to FIG. 10, therein is shown the structure of FIG. 9 in a metallization phase. The transition layer 416 is formed over the semi-conducting layer 414 and the spacer stack 902. The spacer stack 902, having the inter-layer dielectric 422 and the gap filler 420, and the extension 904 serve as an alignment structure assisting in a conformal formation of the transition layer 416.

The transition layer 416 may be formed over the semi-conducting layer 414 and the spacer stack 902 by a number of different processes, such sputtering or CVD. The transition layer 416, comprised of tungsten nitrogen (WN), aids in the adhesion of a metal coating 1002, such as a coating of tungsten, with the semi-conducting layer 414 and with the inter-layer dielectric 422.

The metal coating 1002 may be formed by a number different process, such as sputtering or CVD. The spacer stack 902, the extension 904, and the transition layer 416 serve as an alignment structure for the metal coating 1002.

The structure having the metal coating 1002 undergoes a planarization process forming the metal layer 418 of FIG. 4 from the metal coating 1002 that is substantially coplanar with the inter-layer dielectric 422. The planarization process removes the transition layer 416 above the spacer stack 902 exposing the inter-layer dielectric 422. The metal layer 418 is in a recess 1004 of the transition layer 416 and between the extension 904 of the adjacent instances of the spacer stack 902. The metal layer 418 is also over the substrate 402, the first insulator layer 404, the charge trap layer 410, and the second insulator layer 412.

Figure 11:
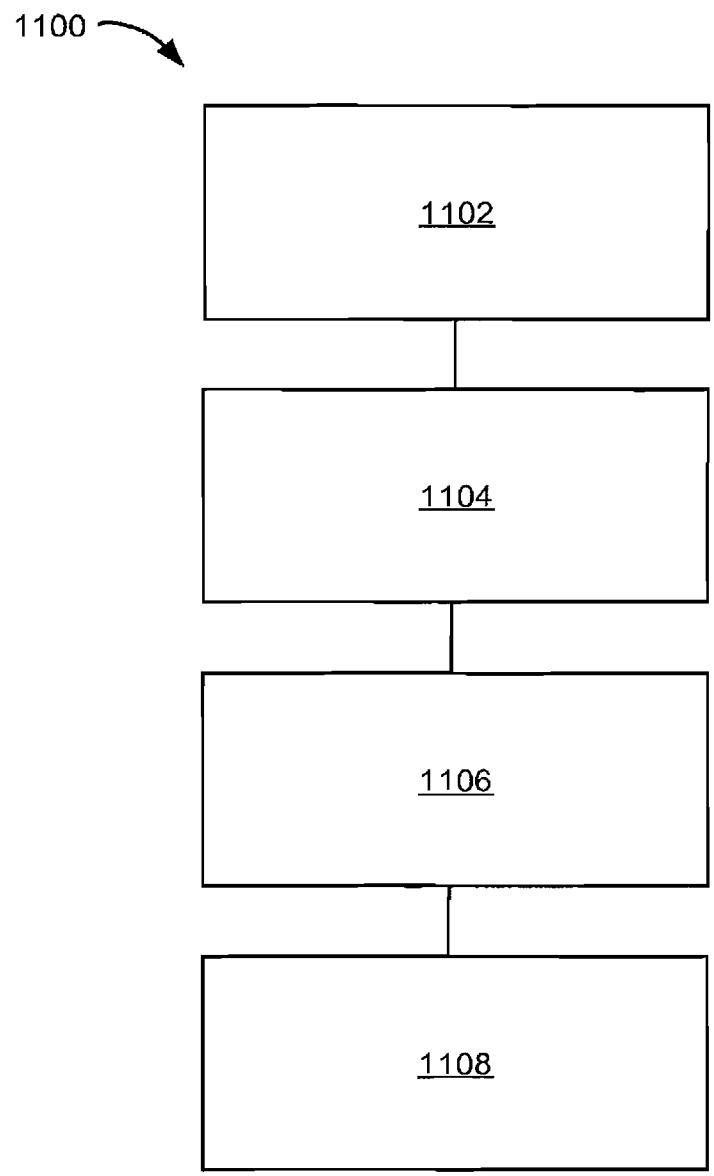
FIG. 11 is a flow chart of an integrated circuit system for manufacture of the m integrated circuit system in an embodiment of the present invention.

Referring now to FIG. 11, therein is shown a flow chart of an integrated circuit system 1100 for manufacture of the integrated circuit system 200 in an embodiment of the present invention. The system 1100 includes forming a semi-conducting layer over a substrate in a block 1102; forming a spacer stack having a gap filler adjacent to the semi-conducting layer and a inter-layer dielectric over the gap filler in a block 1104; forming a transition layer having a recess over the semi-conducting layer and adjacent to the spacer stack in a block 1106; and forming a metal layer in the recess in a block 1108.

It has been discovered that the present invention thus has numerous aspects.

It has been discovered that the present invention improves integrated circuit performance, lowers power, and increases yield by forming a hybrid gate stack having metal and polysilicon gate structure while protecting the gate structure against contamination from the formation of the hybrid structure.

An aspect is that the present invention protects the gate stack or a word line stack from processing steps for the hybrid gate structure, such as thermal annealing, as well as preventing oxidation formation along the sidewalls of the gate stack.

Another aspect of the present invention is that the spacer stack protects the sidewalls of the gate stack. The spacer stack is between adjacent instances of the gate stack and includes a nitride portion adjacent to the gate stack and an oxide portion above the nitride portion to resist the etching process for removing the hard mask layer.

Yet another aspect is that the present invention provides a hybrid metal polysilicon structure reducing resistance for signal routing, power routing, and control gates. The examples described depict the present invention in an embodiment utilized in a Flash memory device, however, present invention may be generally practiced in integrated circuits for different functions.

Yet another aspect of the present invention improves the erase and program performance of the memory system in the integrated circuit system by replacing the higher resistance polysilicon gate with a metallic-polysilicon gate.

Yet another aspect of the present invention is the self-alignment structure formed by the spacer stack and the extension of the spacer stack. The alignment structure outlines the surfaces for the transition layer of tungsten nitride for improved adhesion of the tungsten metal gate over the polysilicon portion of the hybrid structure.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system method and apparatus of the present invention furnish important and heretofore unknown and unavailable solutions, capabilities, and functional aspects for integrated systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for forming an integrated circuit comprising:
   forming a semi-conducting layer over a substrate;
   forming a spacer stack having a gap filler adjacent to the semi-conducting layer and an inter-layer dielectric over the gap filler, the gap filler comprising a different dielectric material than the inter-layer dielectric;
   forming a transition layer having a recess over the semi-conducting layer and adjacent to the spacer stack; and
   forming a metal layer in the recess.

2. The method as claimed in claim 1 wherein forming the semi-conducting layer of the substrate includes forming a charge trap layer over the substrate and below the semi-conducting layer.

3. The method as claimed in claim 1 further comprising planarizing the transition layer and the spacer stack.

4. The method as claimed in claim 1 wherein forming the transition layer adjacent to the spacer stack includes forming the transition layer adjacent to the inter-layer dielectric.

5. The method as claimed in claim 1 further comprising forming an electronic system or a subsystem with the integrated circuit.

6. A method for forming an integrated circuit comprising:
   forming a polysilicon layer over a substrate;
   forming a spacer stack having a nitride gap filler adjacent to the polysilicon layer and an oxide layer over the gap filler;
   forming a tungsten nitride layer having a recess over the polysilicon layer and adjacent to the spacer stack; and
   forming a tungsten layer in the recess.

7. The method as claimed in claim 6 wherein forming the polysilicon layer over the substrate includes:
   forming a charge trap layer over the substrate and below the polysilicon layer; and
   forming the nitride gap filler adjacent to the charge trap layer.

8. The method as claimed in claim 6 further comprising planarizing the tungsten layer, the tungsten nitride layer, and the spacer stack.

9. The method as claimed in claim 6 wherein forming the tungsten nitride layer having the recess over the polysilicon layer and adjacent to the spacer stack includes forming the tungsten nitride layer with a conformal configuration with the polysilicon layer and with an extension of the spacer stack.

10. The method as claimed in claim 6 further comprising forming a gate stack with the tungsten layer over the polysilicon layer.

11. A method for forming an integrated circuit, the method comprising:
    forming a semi-conducting layer over a substrate;
    forming a spacer stack having a gap filler and an inter-layer dielectric over the gap filler, the gap filler comprising a different dielectric material than the inter-layer dielectric;
    forming a transition layer having a recess over the semi-conducting layer;
    forming a metal layer in the recess.

12. The method of claim 11 wherein forming the semi-conducting layer includes forming a charge trap layer over the substrate and below the semi-conducting layer.

13. The method of claim 11 further comprising planarizing the transition layer.

14. The method of claim 11 further comprising planarizing the spacer stack.

15. The method of claim 11 wherein forming the transition layer is formed adjacent to the spacer stack.

16. The method of claim 15 wherein forming the transition layer adjacent to the spacer stack includes forming the transition layer adjacent to the inter-layer dielectric.

17. The method of claim 11 further comprising forming an electronic system with the integrated circuit.

18. The method of claim 11 wherein the semi-conducting layer is a polysilicon layer.

19. The method of claim 11 wherein the gap filler is a nitride gap filler.

20. The method of claim 11 wherein the metal layer in the recess comprises tungsten.

* * * * *